(12) United States Patent
Deak et al.

(10) Patent No.: US 9,123,876 B2
(45) Date of Patent: Sep. 1, 2015

(54) SINGLE-PACKAGE BRIDGE-TYPE MAGNETIC-FIELD ANGLE SENSOR

(75) Inventors: James Geza Deak, Zhangjiagang (CN); Weifeng Shen, Zhangjiagang (CN); Xiaojun Zhang, Zhangjiagang (CN); Xiaofeng Lei, Zhangjiagang (CN); Insik Jin, Zhangjiagang (CN); Songsheng Xue, Zhangjiagang (CN)

(73) Assignee: MultiDimension Technology Co., Ltd. (CN)

( * ) Notice: Subject to any disclaimer, the term of this patent is extended or adjusted under 35 U.S.C. 154(b) by 176 days.

(21) Appl. No.: 14/002,738

(22) PCT Filed: Mar. 2, 2012

(86) PCT No.: PCT/CN2012/071879
§ 371 (c)(1),
(2), (4) Date: Sep. 2, 2013

(87) PCT Pub. No.: WO2012/116659
PCT Pub. Date: Sep. 7, 2012

(65) Prior Publication Data
US 2013/0334634 A1    Dec. 19, 2013

(30) Foreign Application Priority Data
Mar. 3, 2011  (CN) .......................... 2011 1 0050747

(51) Int. Cl.
*H01L 27/22* (2006.01)
*H01L 43/02* (2006.01)
*G01B 7/30* (2006.01)
*G01R 33/09* (2006.01)
*H01L 43/08* (2006.01)
*G01D 5/14* (2006.01)

(52) U.S. Cl.
CPC ........ *H01L 43/02* (2013.01); *G01B 7/30* (2013.01); *G01R 33/098* (2013.01); *G01D 5/145* (2013.01); *H01L 43/08* (2013.01)

(58) Field of Classification Search
CPC ........ G01B 7/30; B62D 5/0484; B62D 5/049; F01K 23/10; F01K 23/101; F02C 1/007; F02C 3/00; F02C 3/34; F16H 59/105; G01D 5/145; G01D 5/00; G01D 5/24438; G01D 5/24476; G01D 5/2457; G01L 3/102
USPC ............ 200/61.88, 61.28; 60/39.181, 39.52, 60/773; 701/43, 30.5; 73/862.333, 73/862.335; 123/376, 25; 257/427; 324/207.12, 207.13, 207.2, 207.21, 324/207.22, 207.25, 252, 259, 262, 661; 338/32 R, 327; 381/370; 702/141, 150, 702/151
IPC   G01B 7/30; B62D 5/0484, 5/049; F01K 23/10, F01K 23/101; F02C 1/007, 3/00, 3/34; F16H 59/105; G01D 5/145, 5/00, 5/24438, 5/24476, G01D 5/2457; G01L 3/102, 3/242; G01R 33/093, 33/0005, 33/0011, 33/0017, 33/0047, G01R 33/02, 33/038, 33/098; H01L 41/125, H01L 43/02, 43/08
See application file for complete search history.

(56) References Cited

U.S. PATENT DOCUMENTS 6,329,818 B1 *  12/2001  Tokunaga et al. ............. 324/252
7,023,310 B2 *  4/2006  Oohashi et al. ............... 335/306
(Continued)

*Primary Examiner* — Julio J Maldonado
*Assistant Examiner* — Robert Bachner
(74) *Attorney, Agent, or Firm* — Schwegman Lundberg & Woessner, P.A.

(57) ABSTRACT

A single-package bridge-type magnetic-field angle sensor comprising one or more pairs of magnetic tunnel junction sensor chips rotated relative to each other by 90 degrees in order to detect two magnetic field components in orthogonal directions respectively is disclosed. The magnetic-field angle sensor may comprise a pair of MTJ full-bridges or half-bridges interconnected with a semiconductor package lead. The magnetic-field angle sensor can be packaged into various low-cost standard semiconductor packages.

16 Claims, 9 Drawing Sheets

(56) References Cited

U.S. PATENT DOCUMENTS

| | | | |
|---|---|---|---|
| 7,982,461 B2 * | 7/2011 | Aiso | 324/252 |
| 2005/0200449 A1 * | 9/2005 | Oohashi et al. | 338/32 R |
| 2008/0297954 A1 * | 12/2008 | Aiso | 360/324.11 |
| 2010/0001723 A1 * | 1/2010 | Van Zon et al. | 324/252 |
| 2011/0025319 A1 * | 2/2011 | Saruki et al. | 324/252 |

* cited by examiner

SINGLE-PACKAGE BRIDGE-TYPE MAGNETIC-FIELD ANGLE SENSOR

CROSS-REFERENCE TO A RELATED APPLICATION

This application is a 35 U.S.C. §371 national phase application of PCT/CN2012/071879, filed on Mar. 2, 2012, which claims priority to a Chinese Patent Application No. CN201110050747.4, filed on Mar. 3, 2011, incorporated herein by reference in its entirety.

FIELD OF THE INVENTION

The present invention relates to an MTJ or GMR angle sensor element, particularly a angle sensor integrated into a single standard semiconductor package.

BACKGROUND OF THE INVENTION

Magnetic sensors are widely used in modern systems to measure or detect physical parameters including but not limited to magnetic field strength, current, position, motion, orientation, and so forth. There are many different types of sensors in the prior art for measuring magnetic field and other parameters. However, they all suffer from various limitations well known in the art, for example, excessive size, inadequate sensitivity and/or dynamic range, cost, reliability and other factors. Thus, there continues to be a need for improved magnetic sensors, especially sensors that can be easily integrated with semiconductor devices and integrated circuits and manufacturing methods thereof.

Magnetic tunnel junction (MTJ) sensors have the advantages of high sensitivity, small size, low cost, and low power consumption. Although MTJ devices are compatible with standard semiconductor fabrication processes, methods for building high sensitivity devices with sufficient yield for low cost mass production have not been adequately developed. In particular, yield issues due to difficulty in MTJ process and backend packaging process, and difficulty in matching the magnetoresistive response of MTJ elements when combined to form bridge sensors have proven difficult.

SUMMARY OF THE INVENTION the present invention is to provide a single-package magnetic angle sensor may be used to measure the value of the angle of the magnetic field in order to remedy the above-mentioned problems.

In order to solve the above technical problem, one aspect of the present invention adopts the technical scheme as follows: a single-package bridge magnetic angle sensor, the sensor comprises two half-bridge sensors, each half-bridge sensor includes a sensor chip, wherein the sensor chip is rotted by 90 degrees relative to another sensor, the sensor chips are attached to the leadframe of a standard semiconductor package, each sensor chip includes a fixed resistance as a reference resistor, and a sensing resistor that ahs a response which varies in proportion to an external magnetic field; each reference resistor and the sensing resistor comprises a plurality of MTJ or GMR sensor elements. The MTJ or GMR sensor elements are arranged in an array and interconnected in order to function as a single bridge arm, each of the reference resistor and the sensing resistor bridge arm further comprises a strip-shaped permanent magnets between the rows of MTJ or GMR elements in order to provide a magnetic bias field; bond pads are provided on the sensor chip which are large enough to permit a plurality of bonding wires to be attached to each side of the bridge arm; The sensor chips are interconnected to each other and the leadframe using wire bonding, and finally the sensor chips and leadframe are encapsulated in plastic to form a standard semiconductor package.

A second implementation of the present inventions is a single-package bridge-type magnetic field angle sensor, wherein the sensor includes two full-bridge sensors, called the first full-bridge sensor and the second full-bridge sensors respectively, each full-bridge sensor consists of two half-bridge sensors, and each half-bridge sensor comprises a single MTJ or GMR magneto-resistive sensor chip. The sensor include a fixed resistance of the reference resistor and a variable resistance sensor that provides an output proportional to the external magnetic field. The sensors are attached to a leadframe and encapsulated in a standard semiconductor package.

Each of the reference resistor and the sensing resistor includes a plurality of MTJ or GMR sensor elements, wherein the MTJ or GMR sensor elements are interconnected as a separate magnetoresistive element also known as a bridge arm. Within the bridge arm, the MTJ or GMR sensor elements are arranged in the form of an array. Each of the reference resistor and the sensing resistor including strip-shaped permanent magnets, to provide a bias field for the magneto-resistive elements. The permanent magnet bars are located between rows of magnetoresistive elements in the bridge arm arrays. Each sensor chip has large bond pads to permit one or more wire bonds to be attached to the same bond pad; The magneto-resistive sensor chips are electrically interconnected and connected to the leadframe using wire bonding, in order to constitute a bridge sensor; The leadframe and the sensor chip are encapsulate in plastic to form a standard semiconductor package.

Preferably, the magnetic angle sensor, characterized in that: the first and second full-bridge sensors comprise two sensor chips rotated by 180 degrees with respect to each other, and the two full-bridge sensor rotated by 90 degrees with respect to each other.

Preferably, the magnetoresistive sensing elements have an oval shape.

Preferably, the magnetoresistive elements of the reference resistor of claims 1 and 2 are patterned in different shape aspect ratio from the magnetoresistive elements of the sensing resistor.

Preferably, the reference resistor is screened from applied magnetic field by one or more magnetic shields.

Preferably, the magnetic angle sensor, characterized in that: said sensor chip is biased using a voltage or a current.

Preferably, the sensor chips are tested and sorted before assembly in order to better match their transfer curve characteristics.

The magnetic angle sensor may contain sensor chips that are set side-by-side for use in detecting magnetic field angle when there is only a small gradient.

The single-package magnetic rotation sensor may contain sensor chips that are arranged such that the chips have a common center in order to provide the capability to measure angle in the presence of a large magnetic field gradient.

DETAILED DESCRIPTION

These sensor elements are configured as spin valves, where one of the magnetic layers has a magnetization with an orientation that is fixed in order to serve as a reference. This fixed layer can be a single magnetic layer or a synthetic ferromagnetic structure, which is pinning by a pinning layer. The other magnetic layer, so called free layer, in a spin valve can rotate in response to the applied magnetic field. The resistance of the spin valve varies with the free layer orientation with respect to the fixed (pinned) layer, and then with the magnetic field on the free layer. In a MTJ element, the free layer and fixed layer are separated by a barrier. Electrical current flows through the barrier. In a GMR element, the free layer and the pinned layer are separated by a non-magnetic metallic layer. Electrical current can flow either in the plane of the multilayer thin film or perpendicular to the plane.

Figure 1:
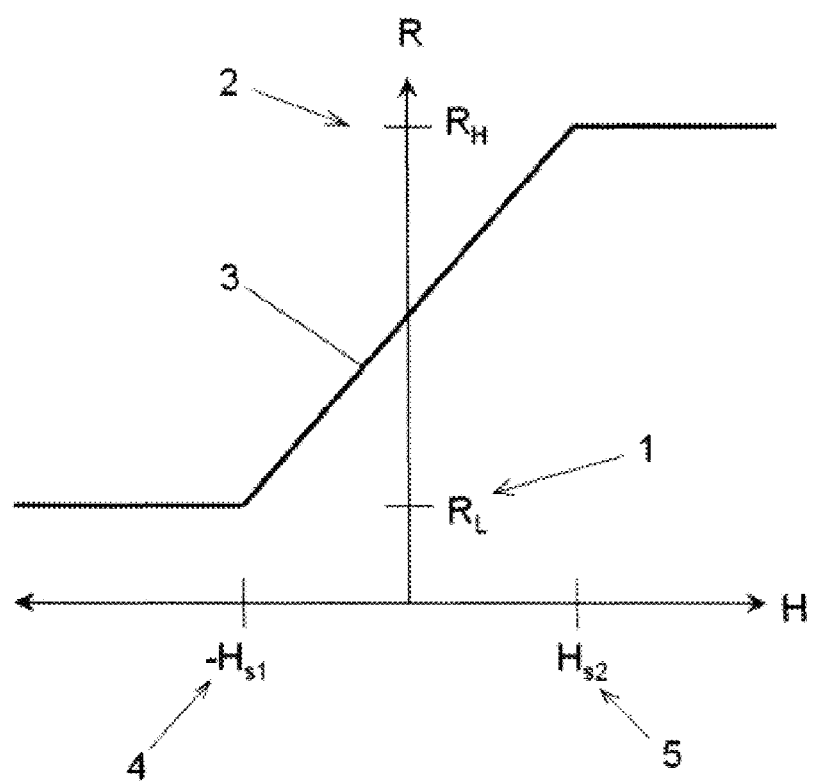
FIG. 1—Schematic drawing of the magnetoresistive response of a spin-valve sensing element with the reference layer magnetization pointing in the negative H direction.

The general form of the magnetoresistive transfer curve of a GMR or MTJ magnetic sensor element suitable for linear magnetic field measurement is shown schematically in FIG. 1. The transfer curves depicted in the figures saturate at low 1 and high 2 resistance values, $R_L$ and $R_H$, respectively. In the region between saturation, the transfer curves are linearly dependent on the applied magnetic field, H. In non-ideal cases, the transfer curves is not symmetric about the H=0 point in the plot. The saturation fields 4 and 5 are typically offset by an amount that is determined by the interlayer coupling between the free layer and the pinned layer. A major contributor to the interlayer coupling, so called Neel coupling or "orange-peel" coupling, is related to roughness of the ferromagnetic films within the GMR and MTJ structures, and it is dependent on materials and manufacturing processes.

Between the saturation fields, 4 and 5, is the operation field region where ideally the response of the MTJ or GMR resistance is linear. Sensitivity of the MTJ element, the slope 3 of the transfer curve in FIG. 1, depends upon the stiffness of the free layer in response to the applied magnetic field. The slope 3 can be tuned by the shape of the MTJ element, to achieve the field sensitivity for specific designs and purposes. Usually MTJ element is pattern into an elongated shape such as but not limited to ellipse, rectangle, and diamond, oriented orthogonally with respect to the pinned layer. In some cases, the free layer can be biased or stabilized by a permanent magnet in the direction perpendicular to the pinning layer. In some cases for high field sensitivity, magnetic field concentrators, or flux guides, can be integrated in the magnetic field sensor to amplify the magnetic field on the free layer of the MTJ elements.

Figure 2:
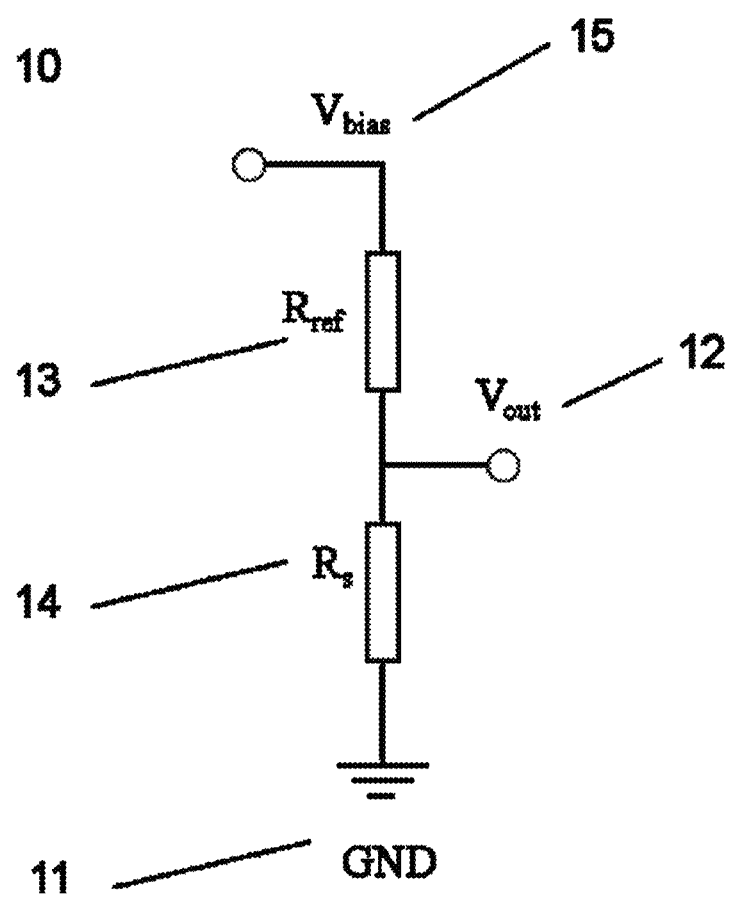
FIG. 2—Schematic drawing of a half-bridge with a fixed reference resistor and a sensing resistor.

FIG. 2 shows the schematic of a half-bridge configuration 10 with a bias voltage 16 connected to one end of a series combination of a reference resistor 13 with a fixed resistance and a sensing resistor 14 of which the resistance that responds to the applied magnetic field. The other end is connected to ground (GND). The output voltage 12 is then the voltage difference across the sensing resistor.

Figure 3:
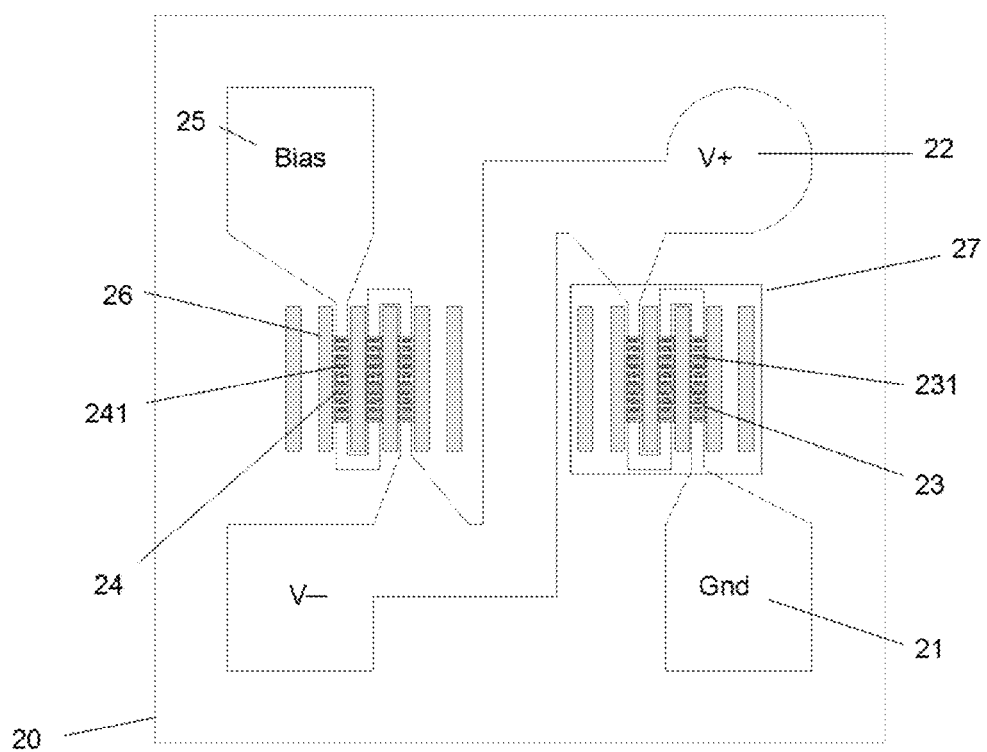
FIG. 3—An embodiment of a half-bridge in a magnetoresistive sensor chip where both reference resistor and sensing resistor made of plural MTJ elements arranged in row arrays and bar-shape permanent magnets are used to bias the MTJ elements FIG. 4—Schematic of a rotation sensor with two half-bridges.

FIG. 3 shows a design of a half-bridge in a magnetoresistive chip 20. Both reference resistor 23 and sensing resistor 24 compose plural MTJ elements, 231, and 241, respectively, which are arranged in row arrays. MTJ elements are connected in series to form the reference resistor and sensing resistor. In between the MTJ element rows there are bar-shaped permanent magnets 26 (PM) to bias the MTJ free layers in the direction perpendicular to the pinned layer. In this case, the PM bars are oriented in the pinned layer magnetization direction. In chip fabrication, the PM's must be magnetized in the direction perpendicular to the pinned layer in order to provide stabilization field for the free layers. The PM's are not necessarily fabricated in the same plane of the MTJs. However, they should be close to provide sufficient bias field strength. Since the reference resistor should not be sensitive to the applied magnetic field, the reference MTJ elements 231 can be with different shape and/or difference shape aspect ratio from the sensing MTJ element 241 to obtain shape anisotropy and magnetic stiffness against applied field. Alternatively, a magnetic shield 27 can be integrated in the chip to screen magnetic field/flux for the reference MTJ elements. In general, the shield is a piece of soft magnet placed on top of the reference MTJ elements, covering all the elements so that it shield the magnetic field from the elements and the fringe field of the shield at the edges will not affect the MTJ elements.

Figure 4:
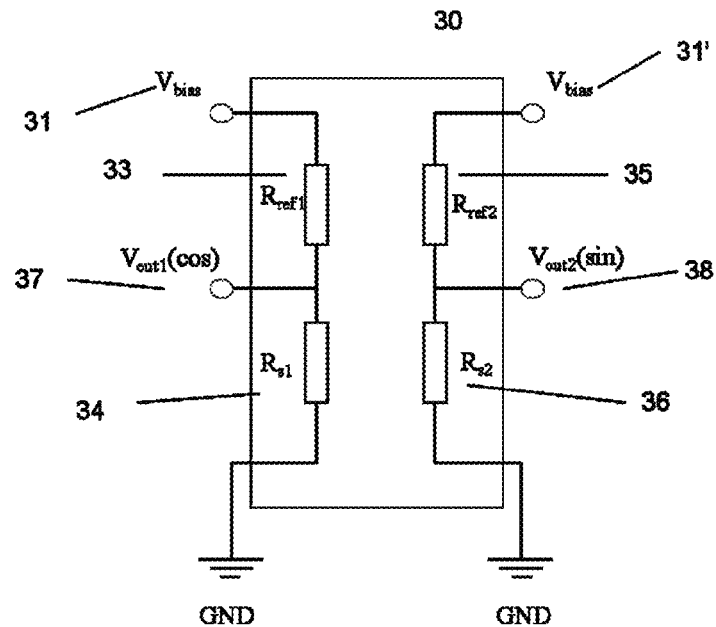
Figure 5:
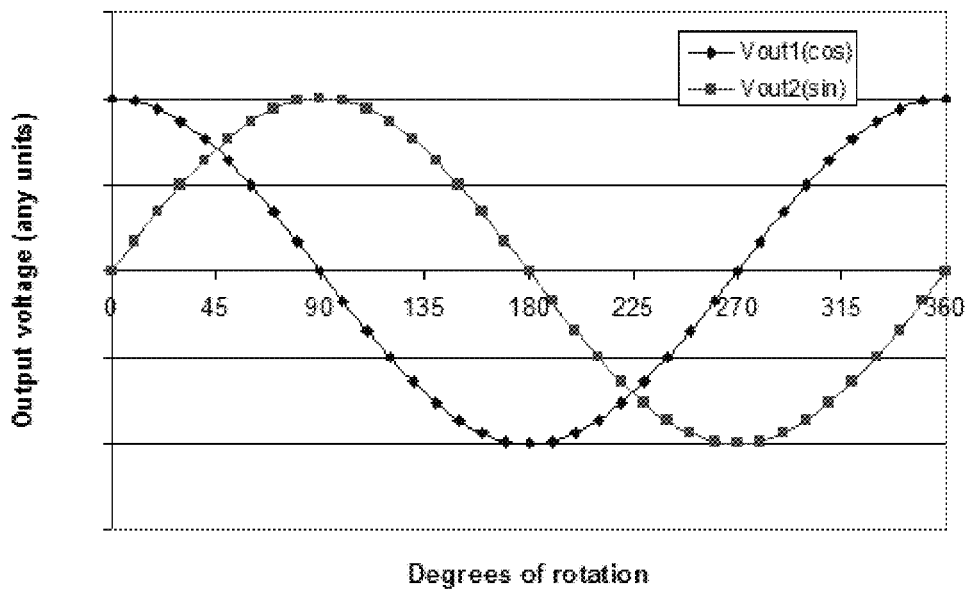
FIG. 5—Schematic of output voltages as functions of rotation angle of the magnetic field relative to the magnetic rotation sensor.

FIG. 4 shows the schematic of a magnetic rotation sensor that is disclosed in this invention. It comprises of two separate half-bridges that respond to the magnetic field in its x-component and y-component, which are defined by the sensor orientation. Under a magnetic field H making an angle θ with respect to the magnetic sensor, the output voltages, 37 and 38, are proportional to H·cos(θ) and H·sin(θ), from which the magnetic field strength and direction can be determined. The two half bridges can share the same terminal for bias and for ground. FIG. 5 shows the output voltages at the two output terminals with respect to the magnetic field angle.

Depending on the design of the magnetic magnet that produces the rotating magnetic field, there will be a gradient in the magnetic field that can be divided into three different cases:

Low magnetic field gradient: In this case sensor chips can be placed side-by-side manner, with no need for a common center for sensor bridges;

Moderate magnetic field gradient, it may be possible to place sensor chips side by side with a common center to reduce the error in the angle due to the field gradient;

High magnetic field gradient: in this case, in this case, a common center is necessary.

The reason for these classifications is if the sensor chips do not have a common center and they are spaced far apart the gradient of the magnetic field generated by the rotating magnet and could have significant errors; When the chips are spaced close together and laid out such that the sensor bridge has a well defined geometric center, a smaller error will result in the angle calculation.

Figure 6:
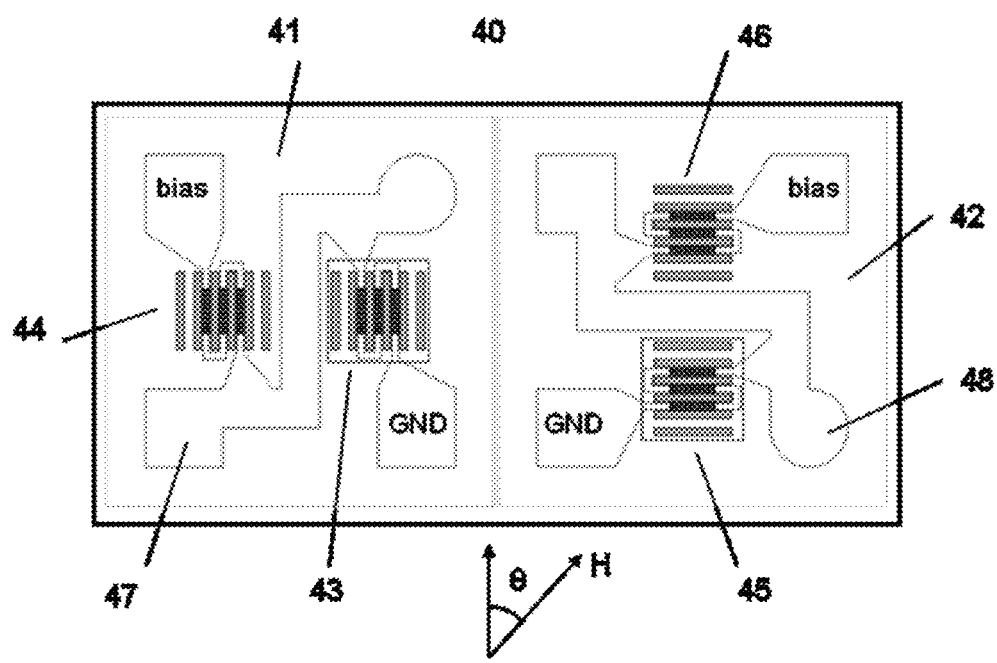
FIG. 6—An embodiment of a rotation sensor comprising of two half-bridge magnetoresistive sensor chips. One is oriented 90° with respect to the other. The chips are placed within a standard semiconductor package FIG. 7—Schematic of a rotation sensor with two full-bridges.

FIG. 6 shows a rotation sensor made of two magnetoresistive sensor chips, 41 and 42, that are illustrated in FIG. 3 packaged together. One of the chips is oriented 90 degrees with respect to the other one. 43 and 44 are the reference resistor and sensing resistor, respectively, for one chip. 45 and 45 are the reference resistor and sensing resistor, respectively, for the other chip. The sense voltage is output from 47 for cosine component and 48 for the sine component.

Figure 7:
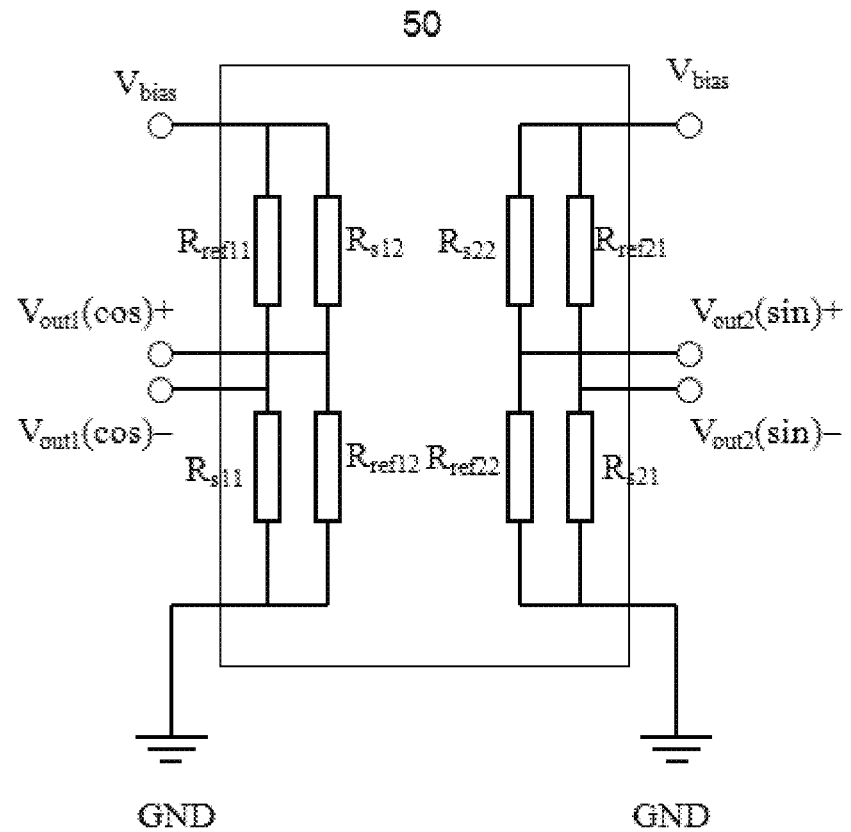

Full-bridges can be used to make magnetic rotation sensors. Full bridge sensor can provide larger output voltage than half-bridge and, therefore, more sensitive to magnetic field. FIG. 7 shows the schematic of a rotation sensor comprising of two separate full-bridges. Each full bridge has two branches that each have a reference resistor arm and a sensing resistor arm. The output is the difference of the voltages on the sensing resistors, i.e., $V_{out1}(\cos)+$ and $V_{out2}(\cos)-$ for a full bridge and $V_{out2}(\sin)+$ and $V_{out2}(\sin)-$ for the other full bridge. The two full bridges are used to detect the x-component (cosine component) and y-component (sine-component) of the magnetic field, respectively.

Figure 8:
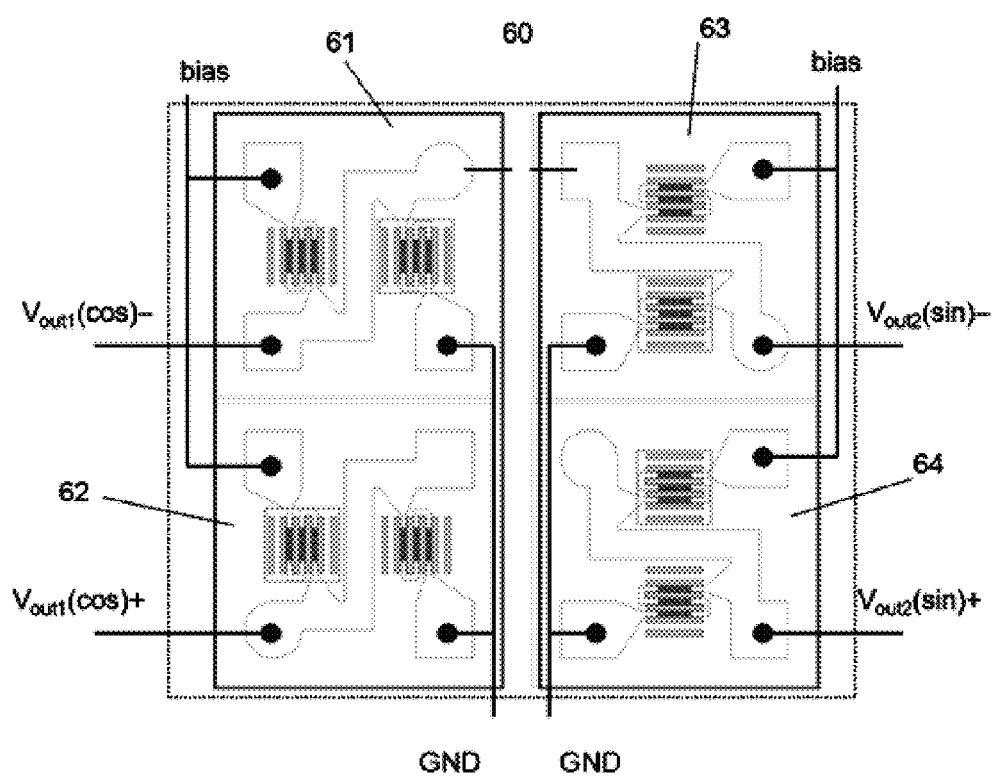
FIG. 8—An embodiment of a rotation sensor comprising of two full-bridges. Each of the full bridges is flip die comprising of two magnetoresistive sensor chips. The chips are placed within a standard semiconductor package

An embodiment of the rotation sensor 60 built with full-bridges is shown in FIG. 8. Each of the full bridge comprises of two magnetoresistive chips illustrated in FIG. 3. Using the flip die technique, in one of the full bridges, magnetoresistive chip 62 is rotated by 180 degree with the other chip 61. Wire bonding is used to connect the corresponding pads to the common bias and the corresponding pads to the common ground. The other full bridges comprises of the building blocks, magnetoresistive chip 63, rotated by 90 degree relative to chip 61, and magnetoresistive chip 64, rotated by 90 degree relative to chip 61. Similar wire bonding scheme to connect the chips to bias and ground. The full bridges may share the terminals for bias and for ground.

Figure 9:
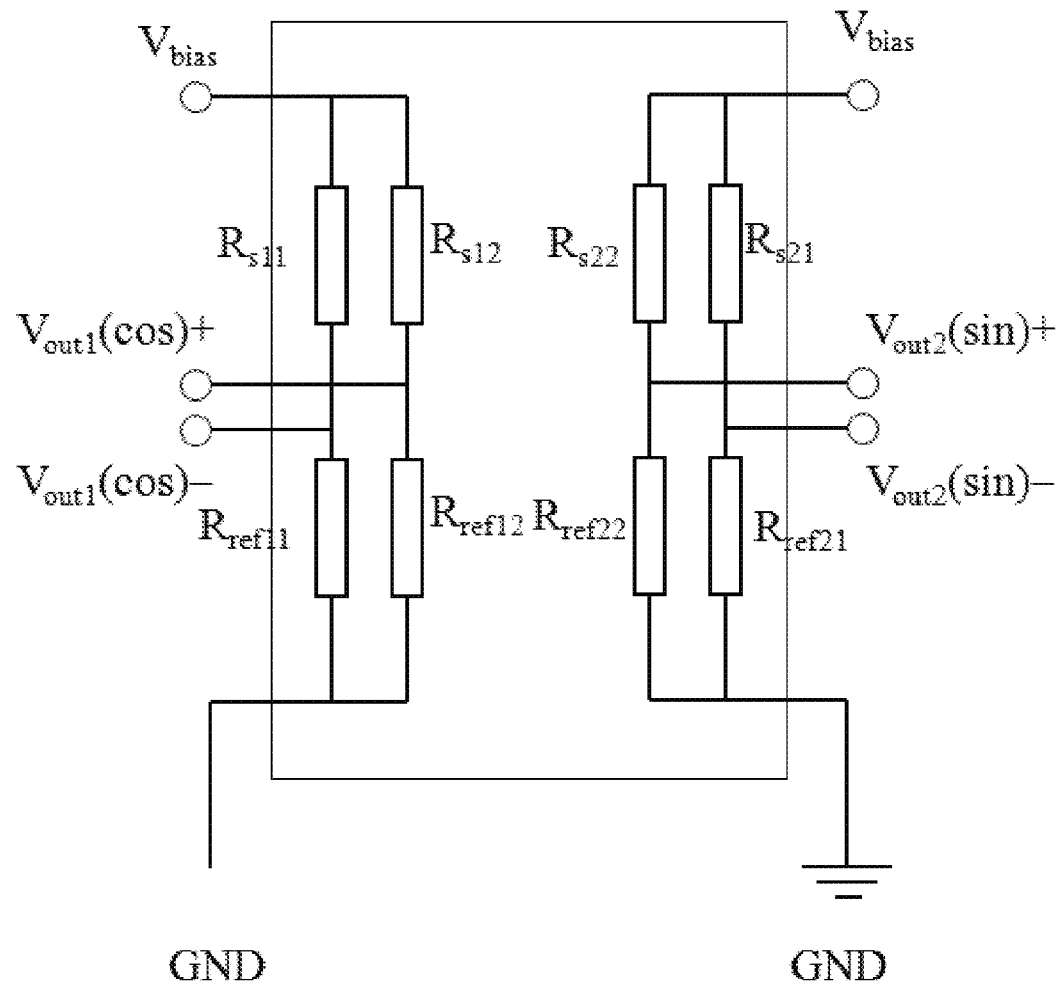
FIG. 9 is a schematic view of an angle sensor composed by two full-bridges having two of the same branch have the same reference resistor.
Figure 10:
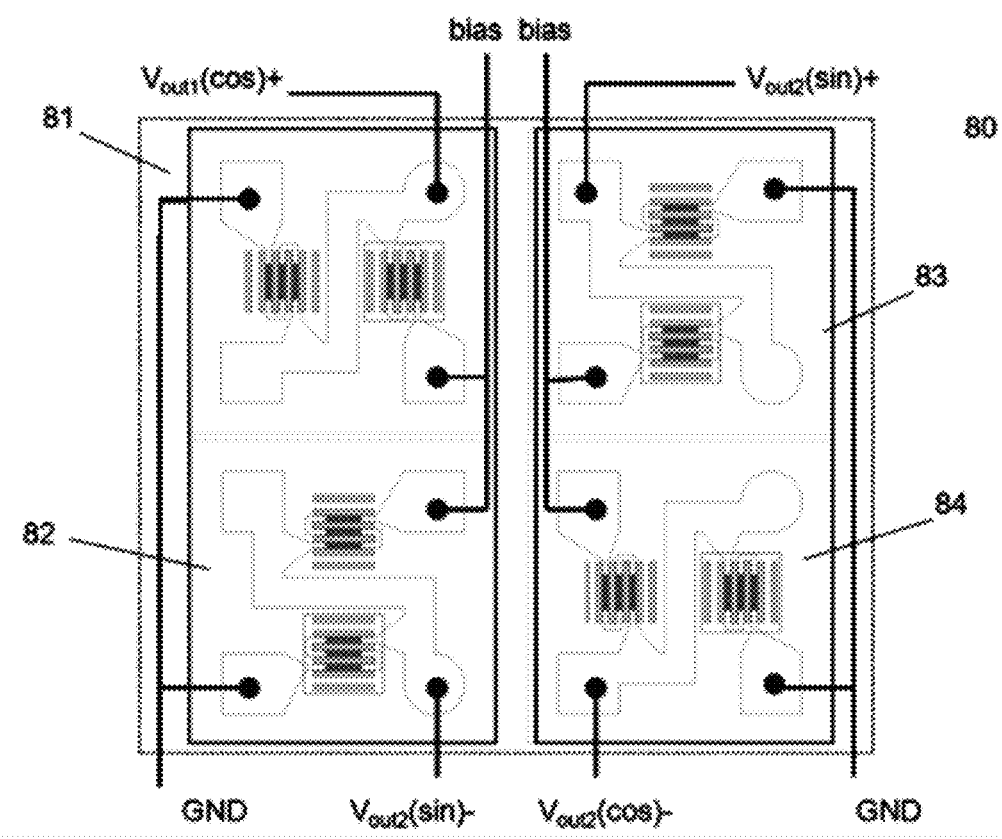
FIG. 10 is another angle sensor composed by two full bridges, each full bridge is composed of two chips rotated relative to each other by 180 degrees and placed in a standard semiconductor package.

The full-bridge angle sensor can be made as shown in FIG. 9 shows another way. Reference resistor in the same branch of the full-bridge. Therefore, sensitive resistor must sense the opposite direction of the magnetic field, means a sensitive resistors increase with increasing magnetic field, the other sensitive resistors decreases with increasing magnetic field. This can be achieved by a flip of the original film. As shown in FIG. 10, the magnetic chip resistors 82, 84 and the chip 83 in the in-plane relative chip 81 is rotated by 90 degrees, 180 degrees, 270 degrees. Magnetoresistance chip 81, 84 to form a full-bridge to sense the magnetic field component of the X-direction, the magnetic resistor chips 82, 83 composed of a full bridge to sense the magnetic field component of the Y direction. After by lead coupled to a common supply voltage Bias and common ground GND connected, after the sensitive voltage Vout1(cos)+Vout1(cos)−VOUT2(sin)+VOUT2(sin)−output, as shown in FIG. 10 shows.

It will be apparent to those skilled in the art that various modifications can be made to the proposed invention without departing from the scope or spirit of the invention. Further, it is intended that the present invention cover modifications and variations of the present invention provided that such modifications and variations come within the scope of the appended claims and their equivalence.

What is claimed is:
1. A single-package magnetic rotation sensor, the sensor comprising

One pair of MTJ or GMR magnetoresistive sensor chips, the MTJ or GMR magnetoresistive sensor chips are adhered to a semiconductor package lead frame;
One of the MTJ or GMR magnetoresistive sensor chips is oriented by 90 degrees with respect to the other one in the pair;
Each MTJ or GMR magnetoresistive sensor chip is a half-bridge, containing a reference resistor with a fixed resistance and a sensing resistor with a resistance varying in response to a magnetic field;
Each of the reference resistor and the sensing resistor contains a plurality of MTJ or GMR sensor elements interconnected as a single magnetoresistive element in row arrays and bar-shaped permanent magnets between the MTJ or GMR sensor elements in the rows to bias the magnetoresistive element;
The sensing resistors have resistance that is linearly proportional to an applied magnetic field over some portion of their magnetoresistive transfer curves;
The bond pads of the sensor chip are designed such that more than one wire bond may be attached to each side of the string of MTJ or GMR sensor elements;
The MTJ or GMR magnetoresistive sensor chips are wire bonded to each other and the semiconductor package lead frame in order to produce a bridge sensor; and
The semiconductor package lead frame and MTJ or GMR magnetoresistive sensor chips are encapsulated in plastic to form a standard semiconductor package.

2. A single-package magnetic rotation sensor, comprising:
A first and a second full-bridge sensor each of the first and second full-bridge sensors comprising two pairs of MTJ or GMR magnetoresistive sensor chips, and the MTJ or GMR magnetoresistive sensor chips are adhered to a semiconductor package lead frame;
Each MTJ or GMR magnetoresistive sensor chip is a half-bridge, containing a reference resistor with a fixed resistance and a sensing resistor with a resistance varying in response to a magnetic field;
Each of the reference resistor and the sensing resistor contain a plurality of MTJ or GMR sensor elements interconnected as a single magnetoresistive element in row arrays with bar-shaped permanent magnets between MTJ or GMR sensor element rows to bias the magnetoresistive elements;
The sensing resistors have resistance that is linearly proportional to an applied magnetic field over some portion of their magnetoresistive transfer curves;
The bond pads of the MTJ or GMR sensor chip are designed such that more than one wire bond may be attached to each side of the string of MTJ or GMR sensor elements;
The MTJ or GMR magnetoresistive sensor chips are wire bonded to each other and the semiconductor package lead frame in order to produce a bridge sensor; and
The semiconductor package lead frame and MTJ or GMR magnetoresistive sensor chips are encapsulated in plastic to form a standard semiconductor package.

3. A single-package magnetic rotation sensor as claimed in claim 2, wherein each full bridge sensor is comprised of two sensor chips rotated by 180 degrees with respect to each other, and the full bridge sensors are aligned at 90 degrees with respect to each other in order to enable two-axis sensing.

4. A single-package magnetic rotation sensor as in claim 1, wherein the magnetoresistive elements are patterned in an elliptical shape.

5. A single-package magnetic rotation sensor as in claim 1, wherein the magnetoresistive elements of the reference resistor are patterned in different shape aspect ratio from the magnetoresistive elements of the sensing resistor.

6. A single-package magnetic rotation sensor as in claim 1, wherein the reference resistor is screened from an applied magnetic field by one or more magnetic shields.

7. A single-package magnetic rotation sensor as claimed in claim 1, wherein said MTJ or GMR magnetoresistive sensor chips are biased using a voltage or a current.

8. A single-package magnetic rotation sensor as in claim 1, wherein the MTJ or GMR magnetoresistive sensor chips are tested and sorted before assembly in order to match their transfer curve characteristics.

9. A single-package magnetic rotation sensor as claimed in claim 1, wherein the MTJ or GMR magnetoresistive sensor chips are set side-by-side for use in detecting a magnetic field angle when there is only a small gradient.

10. A single-package magnetic rotation sensor as claimed in claim 1, wherein the MTJ or GMR magnetoresistive sensor chips are arranged such that the MTJ or GMR magnetoresistive sensor chips have a common center in order to provide the capability to measure an angle in the presence of a large magnetic field gradient.

11. A single-package magnetic rotation sensor as in claim 2, wherein the magnetoresistive elements are patterned in an elliptical shape.

12. A single-package magnetic rotation sensor as in claim 2, wherein the magnetoresistive elements of the reference resistor are patterned in different shape aspect ratio from the magnetoresistive elements of the sensing resistor.

13. A single-package magnetic rotation sensor as claimed in claim 2, wherein said MTJ or GMR magnetoresistive sensor chips are biased using a voltage or a current.

14. A single-package magnetic rotation sensor as in claim 2, wherein the MTJ or GMR magnetoresistive sensor chips are tested and sorted before assembly in order to match their transfer curve characteristics.

15. A single-package magnetic rotation sensor as claimed in claim 2, wherein the MTJ or GMR magnetoresistive sensor chips are set side-by-side for use in detecting a magnetic field angle when there is only a small gradient.

16. A single-package magnetic rotation sensor as claimed in claim 2, wherein the MTJ or GMR magnetoresistive sensor chips are arranged such that the MTJ or GMR magnetoresistive sensor chips have a common center in order to provide the capability to measure an angle in the presence of a large magnetic field gradient.

* * * * *